United States Patent [19]

Chuang et al.

[11] Patent Number: 4,617,086
[45] Date of Patent: Oct. 14, 1986

[54] RAPID ETCHING METHOD FOR SILICON BY SF$_6$ GAS

[75] Inventors: Tung J. Chuang, Los Gatos; Frances A. Houle, Fremont; Kurt E. Petersen, San Jose, all of Calif.

[73] Assignee: International Business Machines Corporation, Armonk, N.Y.

[21] Appl. No.: 360,027

[22] Filed: Mar. 19, 1982

[51] Int. Cl.$^4$ .............. B44C 1/22; C03C 15/00; C03C 20/00; C23F 1/00; H01L 21/306
[52] U.S. Cl. ..................... 156/643; 156/646; 156/662
[58] Field of Search ............ 156/643, 646, 657, 659.1, 156/662, 635; 204/164, 192 E, 298; 219/121 LJ, 121 LM; 427/53.1; 252/79.1

[56] References Cited

U.S. PATENT DOCUMENTS 3,364,087 1/1968 Solomon et al. ............... 156/4
3,886,398 2/1975 Vernon, Jr. et al. ............ 156/17

FOREIGN PATENT DOCUMENTS 52-70498 6/1977 Japan ................... 219/121 LJ

OTHER PUBLICATIONS

Tiee et al., "Argon Fluoride (ARF) Laser Photodissociation . . . ", Chem. Abstracts, 94: 55814q (1981).
"Infrared Laser Induced Reaction of SF$_6$ with Silicon Surfaces", by T. J. Chuang, J. Chem. Phys. 72(11), Jun. 1, 1980, pp. 6303, 6304.
"Laser Chemical Technique for Rapid Direct Writing of Surface Relief in Silicon", by D. J. Ehrlich et al, Appl. Phys. Lett. 38(12), Jun. 15, 1981, pp. 1018–1020.

Primary Examiner—John F. Terapane
Assistant Examiner—Susan Wolffe
Attorney, Agent, or Firm—Joseph E. Kieninger; Henry E. Otto, Jr.

[57] ABSTRACT

A method of etching silicon with a laser at a very fast rate of the order of 45 microns/second includes the steps of providing an atmosphere of sulfur hexafluoride about the silicon and directing a continuous laser beam having a wavelength of about 0.6 or less microns at said silicon.

8 Claims, No Drawings

RAPID ETCHING METHOD FOR SILICON BY SF$_6$ GAS

DESCRIPTION

1. Technical Field

This invention relates to etching silicon and more particularly to etching silicon with a laser at a rate of the order of 45 microns/second.

2. Background Art

U.S. Pat. No. 3,364,087 describes a method of etching materials such as ceramics and semiconductors using a reactive gas such as a halogen, specifically iodine, and oxygen and a laser. The laser may be pulsed or continuous. This patent teaches the use of highly reactive and corrosive halogen gases which have a propensity for interacting strongly with many solids under mild conditions.

U.S. Pat. No. 3,866,398 discloses a means of removing gaseous debris from laser scribing of silicon wafers in order to prevent the redeposition of the gaseous debris onto the active circuit area of the surface. The laser used is specified as one commonly used for scribing. In general, commercial scribing tools use pulsed or continuous YAG or CO$_2$ lasers with the wavelength region being one and ten microns respectively. The gases cited are flowing streams of oxygen, chlorine, halocarbons, carbon tetrachloride, dichlorodifluoromethane and sulfur hexafluoride. The laser power used is sufficiently high so that chunks of the substrate are physically removed defining a kerf at which the wafer is subsequently broken into wafer sections. The purpose of the gas flow through the chamber is to interact with the gases produced from the solid during the scribing so that these gases are removed from the chamber thereby preventing them from redeposition on the circuit. In other words, this patent describes a method for scavaging vaporized material formed in the scribing process.

The article by Chuang in the Journal of Chemical Physics 72 (11) June 1980, page 6303 and in co-pending patent application Ser. No. 06/277,364 filed June 25, 1981, now U.S. Pat. No. 4,331,504 and assigned to the assignee of the present invention disclose etching silicon using a pulsed CO$_2$ laser having a wavelength of 10 microns and an atmosphere of sulfur hexafluoride gas. These etching conditions result in an etch rate of the order of 0.01 microns/second.

The article by Erlich, Osgood and Deutsch in Applied Physics Letter Vol. 38 page 1018 (1981) describes a system in which silicon is etched at a rate of 6 microns/sec. In this system a focused continuous argon laser beam impinges on silicon in the presence of chlorine gas (Cl$_2$). The Cl$_2$ is photodissociated so that the Cl atoms are the primary etchant species. The disadvantage of the Cl$_2$ system is that the gas is poisonous and corrosive and that the Cl atoms are difficult to confine to the target region.

SUMMARY OF THE INVENTION

It is a primary object of this invention to provide an improved method of etching silicon.

It is another object of this invention to provide a fast method of etching silicon.

It is still another object of this invention to provide a method of etching silicon having an etch rate of the order of 45 microns/sec.

It is yet still another object of this invention to provide a method of making deep cuts in silicon.

It is a further object of this invention to provide a maskless method of etching silicon.

It is still a further object of this invention to provide a method of etching silicon to provide feature sizes of the order of 5 microns to 100 microns in size.

These and other objects are accomplished by etching silicon with a laser in an atmosphere of sulfur hexafluoride. The continuous laser beam has a wavelength of about 0.6 or less microns. The laser is focused into a spot to provide a power density of at least $6 \times 10^5$ w/cm$^2$ for silicon wafers or a power density of $1 \times 10^5$ w/cm$^2$ for silicon films having a thickness of 1 micron on a glass substrate. In a preferred embodiment a focused argon laser having a light wavelength of 5145Å and a power density of $4 \times 10^6$ w/cm$^2$ is directed at a silicon wafer. The silicon wafer surrounded by an atmosphere of SF$_6$ at a pressure of 500 Torr is etched to a depth of 90 microns in two seconds.

Other objects of this invention will be apparent from the following detailed description wherein the specific embodiments of the invention are shown.

DESCRIPTION OF THE PREFERRED EMBODIMENTS

Silicon wafers are etched at a rate of the order of 45 microns/sec. by a method that includes the step of providing an atmosphere of sulfur hexafluoride about the silicon and directing a continuous laser beam having a wavelength of about 0.6 or less microns at the silicon. A preferred laser is the argon laser having a wavelength 0.51 to 0.46 microns. The wavelength can be 5145 Å or with particular internal optics, it can be 0.35 microns, where silicon absorbs strongly. A kypton laser having a wavelength of 0.65 microns may be used with special optics to provide a wavelength of 0.41 microns.

The laser is usually focused into a spot to provide a power density of $6 \times 10^5$ w/cm$^2$ for silicon wafers or $1 \times 10^5$ w/cm$^2$ or higher for a silicon film less than a micron thick on glass. Most continuous lasers need to be focused in order to provide such a power density as well as to etch feature sizes of the order of 100 microns or less. An example is for an argon laser operating on the 5145 Å line with 7 watts of power is focused by a 2 cm focal length lens through a quartz window onto a silicon wafer. To be self contained the cell containing the wafer is filled with SF$_6$ gas and sealed. The pressure of the SF$_6$ gas in the sealed cell is between 5 Torr and 500 Torr.

This combination of continuous visible light and SF$_6$ results in a very high etch rate of silicon. This results in an effective etch rate of the order of 45 microns/sec. This unexpectedly high etch rate is a lower limit because the laser light is continually defocused as the hole becomes deeper. Shallower features could be etched even more rapidly.

The features etched by this method range in size from 5 microns to 100 microns. For example, a hole 5 microns in diameter may be etched. Another feature is a trench that is 5 microns wide or a trench 100 microns wide. The width of the trench and the diameter of the hole can be controlled by the laser power density and/or by the radiation time.

This etching process has a number of advantages over the prior art laser method using chlorine gas. The etch rate is faster by at least a factor of 8. Since the SF$_6$ is an inert noncorrosive material, the process does not cause the corrosion of any of the parts including the wafer holder. Since SF$_6$ will not react with silicon without radiation, there is no background etching. This in essence permits a maskless method of etching that has the ability to not only provide etching in a very fast time, but also permits the etching of very small features in the silicon. This method has application in laser personalization of microcircuits and micromechanical device fabrication in silicon.

EXAMPLES

|  | Example | | |
| --- | --- | --- | --- |
|  | 1 | 2 | 3 |
| Laser type | Argon | Argon | Argon |
| Laser wavelength | 5145Å | .51 to .41μ | 5145Å |
| Laser Power | 7 watts | 8 watts | 0.1 watts |
| Laser power density | 4 × 10$^6$ w/cm$^2$ | 4.5 × 10$^6$ w/cm$^2$ | 1 × 10$^5$ w/cm$^2$ |
| Si wafer, thickness | 90μ | 250μ | — |
| Si Film on a quartz substrate, thickness | — | — | 0.5μ |
| Etching time | 2 sec | 5 sec |  |
| Etching rate | 45 μ/sec | 50 μ/sec | 27 μ/sec$^a$ |
| Gas | SF$_6$ | SF$_6$ | SF$_6$ |
| Gas Pressure | 500 Torr | 100 Torr | 5 Torr |

$^a$limited accuracy due to apparatus

Although a preferred embodiment of this invention has been described, it is understood that numerous variations may be made in accordance with the principles of this invention.

What is claimed is:

1. A method of etching silicon comprising the steps of providing an atmosphere of sulfur hexafluoride about said silicon, and
directing a continuous laser beam having a wavelength of about 0.6 or less microns at said silicon whereby said silicon absorbs light from said beam and is etched at a rate of the order of 45 microns per second.

2. A method as described in claim 1 whereby the laser is krypton.

3. A method as described in claim 1 whereby the laser is argon.

4. A method as described in claim 3 whereby the wavelength is between 0.51 microns to 0.46 microns.

5. A method as described in claim 1 whereby said laser provides a power density $\geq 6 \times 10^5$ w/cm$^2$ to said silicon when the silicon is in the form of a wafer.

6. A method as described in claim 1 whereby said laser provides a power density $\geq 1 \times 10^5$ w/cm$^2$ to said silicon when the silicon is in the form of a thin film on a substrate.

7. A method as described in claim 1 whereby said atmosphere of sulfur hexafluoride is 5 Torr to 500 Torr.

8. A method as described in claim 1 whereby said laser is focused at said silicon.

* * * * *